US009798240B2

(12) United States Patent
Xie et al.

(10) Patent No.: US 9,798,240 B2
(45) Date of Patent: *Oct. 24, 2017

(54) CONTROLLING PHOTO ACID DIFFUSION IN LITHOGRAPHY PROCESSES

(71) Applicant: Applied Materials, Inc., Santa Clara, CA (US)

(72) Inventors: Peng Xie, Fremont, CA (US); Ludovic Godet, Sunnyvale, CA (US); Christopher Bencher, Cupertino, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 220 days.

This patent is subject to a terminal disclaimer.

(21) Appl. No.: 14/472,306

(22) Filed: Aug. 28, 2014

(65) Prior Publication Data
US 2016/0011518 A1 Jan. 14, 2016

Related U.S. Application Data

(60) Provisional application No. 62/023,106, filed on Jul. 10, 2014.

(51) Int. Cl.
*G03F 7/20* (2006.01)
*G03F 7/38* (2006.01)
*G03F 7/004* (2006.01)
*G03F 7/26* (2006.01)

(52) U.S. Cl.
CPC ............. *G03F 7/38* (2013.01); *G03F 7/0045* (2013.01); *G03F 7/26* (2013.01)

(58) Field of Classification Search
CPC .................... G03F 7/70658; G03F 7/70875
USPC .................................. 430/328, 330
See application file for complete search history.

(56) References Cited

U.S. PATENT DOCUMENTS

| 6,242,164 B1* | 6/2001 | Choi ..................... G03F 7/38 430/311 |
| 9,377,692 B2* | 6/2016 | Xie ........................ G03F 7/38 |
| 2007/0000613 A1* | 1/2007 | Pau ........................ B01F 3/02 156/345.43 |
| 2011/0226759 A1* | 9/2011 | Wander ............. H01L 21/67109 219/702 |

* cited by examiner

*Primary Examiner* — Daborah Chacko Davis
(74) *Attorney, Agent, or Firm* — Patterson + Sheridan LLP

(57) ABSTRACT

Methods and apparatuses for minimizing line edge/width roughness in lines formed by photolithography are provided. The random diffusion of acid generated by a photoacid generator during a lithography process contributes to line edge/width roughness. Methods disclosed herein apply an electric field, a magnetic field, and/or a standing wave during photolithography processes. The field and/or standing wave application controls the diffusion of the acids generated by the photoacid generator along the line and spacing direction, preventing the line edge/width roughness that results from random diffusion. Apparatuses for carrying out the aforementioned methods are also disclosed herein.

12 Claims, 8 Drawing Sheets

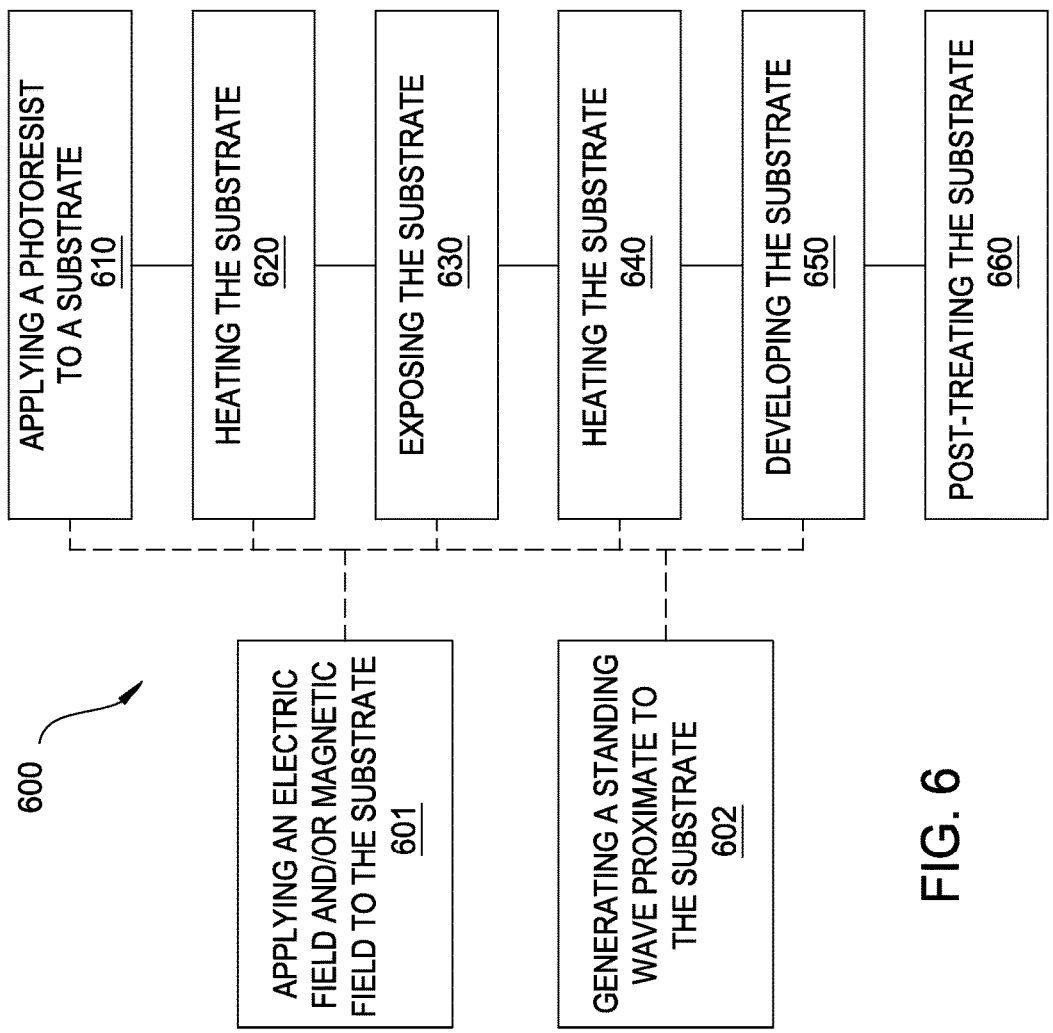

CONTROLLING PHOTO ACID DIFFUSION IN LITHOGRAPHY PROCESSES

CROSS-REFERENCE TO RELATED APPLICATIONS

This application claims priority to U.S. Provisional Patent Application Ser. No. 62/023,106, filed on Jul. 10, 2014, which is hereby incorporated herein by reference.

BACKGROUND

Field

The present disclosure generally relates to methods and apparatuses for processing a substrate, and more specifically to methods and apparatuses for controlling photoresist line edge/width roughness.

Description of the Related Art

Integrated circuits have evolved into complex devices that can include billions of components (e.g., transistors, capacitors and resistors) on a single chip. Photolithography may be used to form components on a chip. Generally, the process of photolithography involves several basic stages. First, a photoresist layer is formed on a substrate. The photoresist layer may be formed using a variety of techniques, such as spin-coating. A chemically-amplified photoresist may include a resist resin and a photoacid generator. Upon exposure to electromagnetic radiation during an exposure stage, the photoacid generator alters the solubility of the photoresist, enabling portions of the photoresist to be removed during a development stage. The electromagnetic radiation may have any suitable wavelength, such as a wavelength in the extreme ultraviolet (UV) range. Electromagnetic radiation may be generated using any suitable source, for example, via a 193 nm ArF laser, an electron beam, an ion beam, or another source. Excess solvent may then be removed during a pre-exposure bake stage.

During the exposure stage, a photomask or reticle may be used to selectively expose certain regions of the substrate to electromagnetic radiation. Other exposure methods may include maskless exposure methods. Exposure to electromagnetic radiation may cause the photoacid generator to release acids, creating a latent acid image in the resist resin. After exposure, the substrate may be heated in a post-exposure bake stage. During the post-exposure bake stage, acid released by the photoacid generator reacts with the resist resin, changing the solubility of the resist resin.

After the post-exposure bake, the substrate and, particularly, the photoresist layer may be developed and rinsed. After development and rinsing, the pattern of the mask is transferred to the substrate.

As processor architectures continue to evolve, higher circuit densities and lower leakage currents become more desirable. The demand for higher circuit densities necessitates a reduction in the dimensions of integrated circuit components. Accordingly, the lithography process must precisely transfer smaller and smaller features onto a substrate without causing damage to the substrate. In order to precisely and accurately transfer features onto a substrate, high-resolution lithography techniques may implement light sources that provide electromagnetic radiation having short wavelengths. Decreasing the wavelength of electromagnetic radiation used during lithography enables the minimum feature size of circuit components to be reduced. However, as the minimum feature size is reduced, the edge roughness of the photoresist layer typically becomes more difficult to control.

Therefore, there is a need for improved techniques for controlling line edge/width roughness.

SUMMARY

In one embodiment, an apparatus for processing a substrate includes a substrate support, a heat source, and an electrode assembly. The substrate support includes a surface configured to support a substrate thereon. The heat source is configured to heat a substrate positioned on the surface of the substrate support. The electrode assembly is positioned proximate to the surface of the substrate support. The electrode assembly includes a plurality of individually addressable electrodes, each individually addressable electrode including one or more antennas. The electrode assembly is configured to generate an electric field in a direction substantially parallel to the surface of the substrate support.

In another embodiment, a method of processing a substrate includes applying a photoresist layer that includes a photoacid generator to a substrate. The method further includes exposing portions of the photoresist layer to electromagnetic radiation to form substantially parallel lines of material in the photoresist layer having different chemical properties than the portions of the photoresist layer not exposed to the electromagnetic radiation. The method further includes heating the substrate after exposing the substrate, and applying an electric field to the substrate in a direction parallel to the direction of the lines with an electrode assembly positioned proximate to the substrate. The electrode assembly includes a plurality of individually addressable electrodes, each individually addressable electrode including one or more antennas. The electric field is applied during the heating.

In yet another embodiment, an apparatus for processing a substrate includes a substrate support, a heat source, a cavity, and at least one generator. The substrate support includes a surface configured to support a substrate thereon. The heat source is configured to heat a substrate positioned on the surface of the substrate support. The cavity is positioned proximate to the surface of the substrate support. The at least one generator is proximate to the cavity and configured to generate a standing wave within the cavity.

In yet another embodiment, a method of processing a substrate includes applying a photoresist layer that includes a photoacid generator to a substrate. The method further includes exposing portions of the photoresist layer to electromagnetic radiation to form substantially parallel lines of material in the photoresist layer having different chemical properties than the portions of the photoresist layer not exposed to the electromagnetic radiation. The method further includes heating the substrate after exposing the substrate, and generating a standing wave proximate to the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6 is a flow diagram of representative methods of processing a substrate.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Methods and apparatuses for minimizing line edge/width roughness in lines formed by photolithography are provided. The random diffusion of acid generated by a photoacid generator during a post-exposure bake procedure contributes to line edge/width roughness. Methods disclosed herein apply an electric field and/or a magnetic field during photolithography processes. The application of an electric field, a magnetic field, and/or a standing wave controls the diffusion of acid along the line and spacing direction, reducing line edge/width roughness that may result from random diffusion. Apparatuses for carrying out the aforementioned methods are also disclosed herein.

Figure 1:
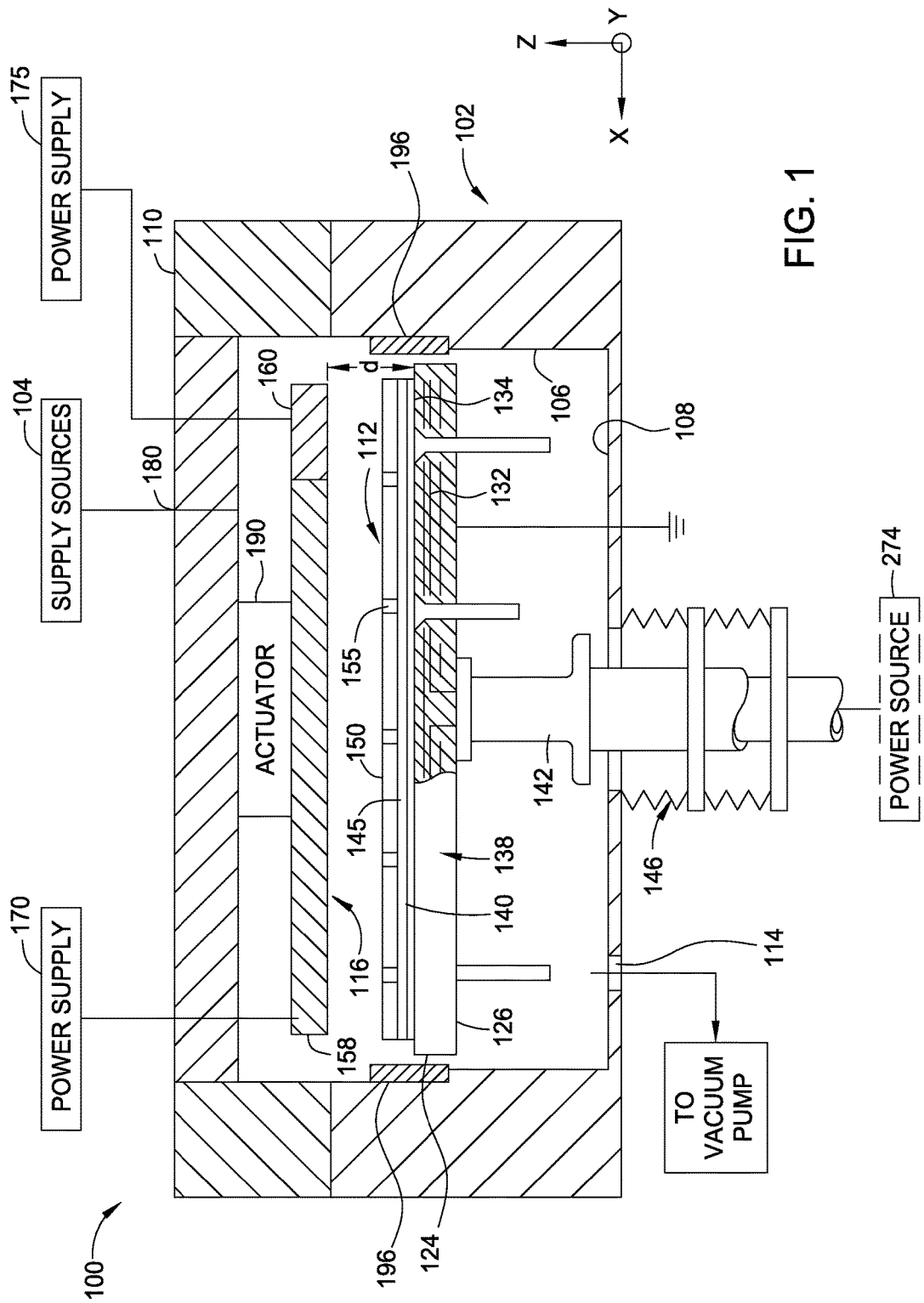
FIG. 1 is a schematic cross-sectional view of an apparatus for processing a substrate.

FIG. 1 is a schematic cross-sectional view of an apparatus for processing a substrate, according to one embodiment. As shown in the embodiment of FIG. 1, the apparatus may be in the form of a vacuum processing chamber 100. In other embodiments, the processing chamber 100 may not be coupled to a vacuum source.

Figure 7:
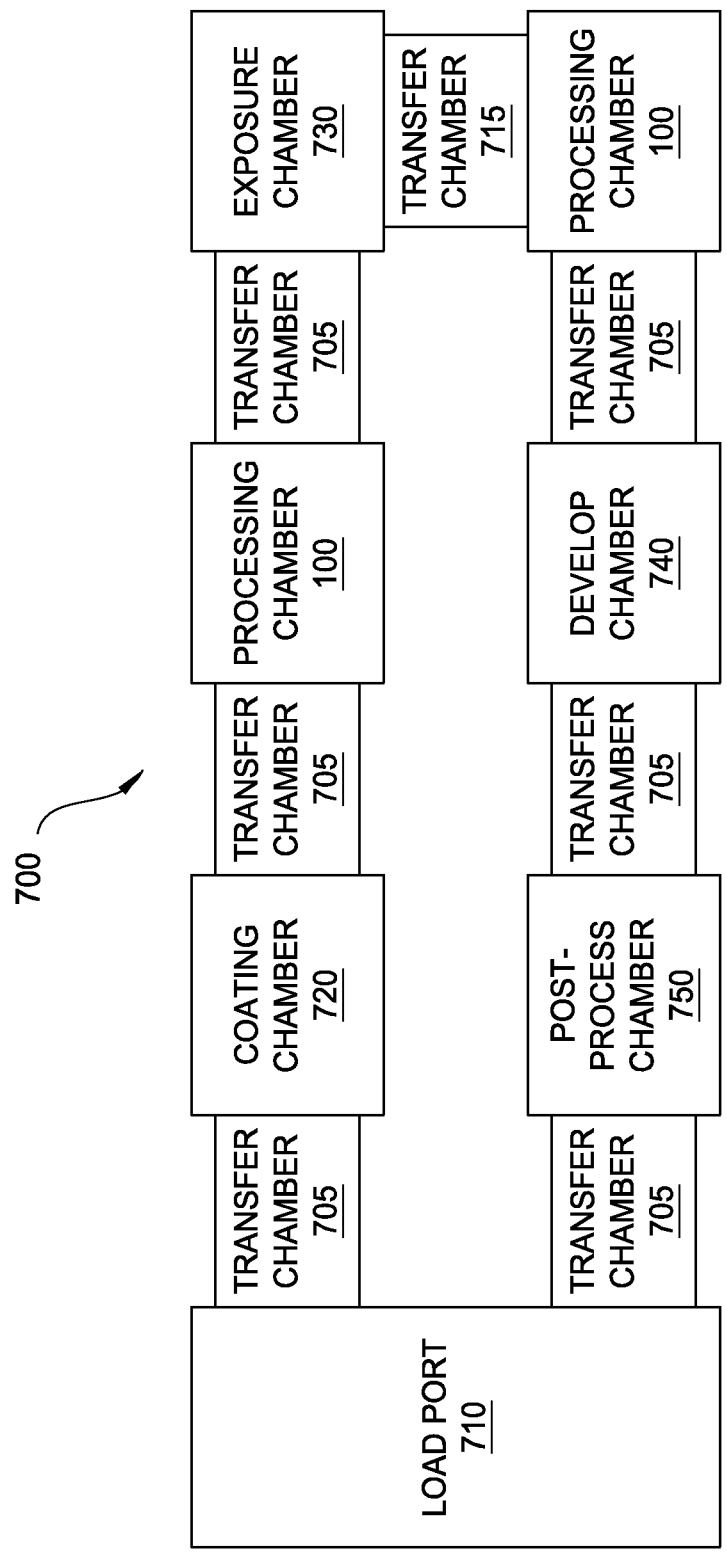
FIG. 7 illustrates one representative processing system that may be used to process a substrate according to embodiments disclosed herein.

The processing chamber 100 may be an independent processing chamber. Alternatively, the processing chamber 100 may be part of a processing system, such as, for example, an in-line processing system, a cluster processing system, or the track processing system shown in FIG. 7. FIG. 7 illustrates one representative processing system 700 that may be used to process a substrate according to embodiments disclosed herein. The processing system 700 includes a load port 710, a coating chamber 720, a processing chamber 100, an exposure chamber 730 (such as a scanner), a second processing chamber 100, a development chamber 740, and a post-process chamber 750. Each chamber of the processing system 700 is coupled to each adjacent chamber by a transfer chamber 705 or a transfer chamber 715. The transfer chambers 705 and the transfer chamber 715 may be substantially similar or different.

The load port 710 may be used to introduce or remove substrates into or out of the processing system 700. The coating chamber 720 may be used, for example, for applying a photoresist to a substrate. The coating chamber 720 may be, for example, a spin coater. The exposure chamber 730 may be used for exposing the substrate to electromagnetic energy in order to form a latent acid image in a photoresist layer on a substrate. The development chamber 740 may be used, for example, for removing portions of the photoresist layer. The post-process chamber 750 may be used, for example, to perform a variety of post-processing steps on a substrate. The processing chamber 100 is described in detail below and may be used for a pre-exposure bake, a post-exposure bake, and/or other processing steps. As described below, the processing chamber 100 may include an electrode assembly 116 and/or a cavity 502 (e.g., an electromagnetic cavity or optical cavity). However, it is to be understood that the coating chamber 720, the exposure chamber 730, and the development chamber 740 may also include an electrode assembly 116 and/or a cavity 502.

The processing chamber 100 includes chamber walls 102, an electrode assembly 116, and a substrate support assembly 138. The chamber walls 102 include sidewalls 106, a lid assembly 110, and a bottom 108. The chamber walls 102 partially enclose a processing volume 112. The processing volume 112 is accessed through a substrate transfer port (not shown) configured to facilitate movement of a substrate 140 into and out of the processing chamber 100. In embodiments where the processing chamber 100 is part of a processing system, the substrate transfer port may allow for the substrate 140 to be transferred to and from a transfer chamber.

A pumping port 114 may optionally be disposed through one of the lid assembly 110, sidewalls 106 or bottom 108 of the processing chamber 100 to couple the processing volume 112 to an exhaust port. The exhaust port couples the pumping port 114 to various vacuum pumping components, such as a vacuum pump. The pumping components may reduce the pressure of the processing volume 112 and exhaust any gases and/or process by-products out of the processing chamber 100. The processing chamber 100 may be coupled to one or more supply sources 104 for delivering one or more source compounds into the processing volume 112.

The substrate support assembly 138 is centrally disposed within the processing chamber 100. The substrate support assembly 138 supports the substrate 140 during processing. The substrate support assembly 138 may comprise an aluminum body 124 that encapsulates at least one embedded heater 132. In some embodiments, the substrate support assembly 138 may be an electrostatic chuck. The electrostatic chuck may have one or more temperature zones for uniform control of temperature on the wafer. In other embodiments, the substrate support assembly 138 may be a vacuum chuck that secures the wafer. The heater 132, such as a resistive element, is disposed in the substrate support assembly 138. The heater 132 controllably heats the substrate support assembly 138 and the substrate 140 positioned thereon to a predetermined temperature. The heater 132 is configured to quickly ramp the temperature of the substrate 140 and to accurately control the temperature of the substrate 140. In some embodiments, the heater 132 is connected to and controlled by the power source 174. The power source 174 may alternatively or additionally apply power to the substrate support assembly 138. The power source 174 may be configured similarly to the power source 170, discussed below.

In some embodiments, the substrate support assembly 138 may be configured to rotate. In some embodiments, the substrate support assembly 138 is configured to rotate about the z-axis. The substrate support assembly 138 may be configured to continuously or constantly rotate, or the substrate support assembly 138 may be configured to rotate in a step manner. For example, the substrate support assembly 138 may rotate a predetermined amount, such as 90°, 180°, or 270°, and then rotation may stop for a predetermined amount of time.

In other embodiments, the processing chamber 100 may include other heating sources. For example, heat lamps may be positioned within or outside the processing chamber 100. In other embodiments, one or more lasers may be used to heat a photoresist layer 150 (or other layer) positioned on the substrate 140 and/or the antennas 220 and 221 of the electrode assembly 116. In other embodiments, the substrate support assembly 138 may be configured to circulate a high efficiency heat transfer fluid in order to more quickly increase the temperature of a substrate 140 positioned on the substrate support assembly 138.

Generally, the substrate support assembly 138 has a first surface 134 and a second surface 126. The first surface 134 is opposite the second surface 126. The first surface 134 is configured to support the substrate 140. The second surface 126 has a stem 142 coupled thereto. The substrate 140 is positioned on the first surface 134 of the substrate support assembly 138. In some embodiments, the substrate support assembly 138 includes a cavity in which the substrate 140 may be positioned.

The substrate 140 may be any type of substrate, such as a dielectric substrate, a glass substrate, a semiconductor substrate, or a conductive substrate. The substrate 140 may have a layer 145 disposed thereon. The layer 145 may be any desired layer. In other embodiments, the substrate 140 may have more than one layer 145. The substrate 140 also has a photoresist layer 150 disposed over the layer 145. The substrate 140 has been previously exposed to electromagnetic radiation in an exposure stage of a photolithography process. The photoresist layer 150 has latent image lines 155 formed therein from the exposure stage. The latent image lines 155 may be substantially parallel. In other embodiments, the latent image lines 155 may not be substantially parallel.

The first surface 134 of the substrate support assembly 138 may be separated from the electrode assembly 116 by a distance d in the z-direction. The stem 142 is coupled to a lift system (not shown) for moving the substrate support assembly 138 between an elevated processing position (as shown) and a lowered substrate transfer position. The separation may be enabled by moving the stage, by moving the electrode, or by moving both. The lift system may accurately and precisely control the position of the substrate 140 in the z-direction. In some embodiments, the lift system may also be configured to move the substrate 140 in the x-direction, the y-direction, or the x-direction and the y-direction. The stem 142 additionally provides a conduit for electrical and thermocouple leads between the substrate support assembly 138 and other components of the processing chamber 100. A bellows 146 is coupled to the substrate support assembly 138 to provide a vacuum seal between the processing volume 112 and the atmosphere outside the processing chamber 100 and facilitate movement of the substrate support assembly 138 in the z-direction.

The lid assembly 110 may optionally include an inlet 180 through which gases provided by the supply sources 104 may enter the processing chamber 100. The supply sources 104 may optionally controllably pressurize the processing volume 112 with a gas, such as nitrogen, argon, helium, other gases, or combinations thereof. The gases from the supply sources 104 may create a controlled environment within the processing chamber 100. An actuator 190 may be optionally coupled between the lid assembly 110 and the electrode assembly 116. The actuator 190 is configured to move the electrode assembly 116 in one or more of the x, y, and z directions. The x and y directions are referred to herein as the lateral directions or dimensions. The actuator 190 enables the electrode assembly 116 to scan the surface of the substrate 140. The actuator 190 also enables the distance d to be adjusted. In some embodiments the electrode assembly 116 is coupled to the lid assembly 110 by a fixed stem (not shown). In other embodiments, the electrode assembly 116 may be coupled to the inside of the bottom 108 of the processing chamber 100, to the second surface 126 of the substrate support assembly 138, or to the stem 142. In still other embodiments, the electrode assembly 116 may be embedded between the first surface 134 and the second surface 126 of the substrate support assembly 138.

The electrode assembly 116 may include plurality of electrodes, such as a first electrode 158 and a second electrode 160. As shown, the first electrode 158 is coupled to a power supply 170, and the second electrode 160 is coupled to an optional power supply 175. In other embodiments, one of the first electrode 158 and the second electrode 160 may be coupled to a power supply and the other electrode may be coupled to a ground. In some embodiments the first electrode 158 and the second electrode 160 are coupled to a ground and the power supply 174 delivers power to the substrate support and is a bipolar power supply that switches between a positive and negative bias. In some embodiments, the power supply 170 or the power supply 175 may be coupled to both the first electrode 158 and the second electrode 160. In other embodiments, the power supply 170 or the power supply 175 may be coupled to the first electrode 158, the second electrode 160, and the substrate support assembly 138. In such embodiments, the pulse delay to each of the first electrode 158, the second electrode 160, and the substrate support assembly 138 may be different. The electrode assembly 116 may be configured to generate an electric field parallel to the x-y plane defined by the first surface of the substrate support assembly 138. For example, the electrode assembly 116 may be configured to generate an electric field in one of the y direction, x direction or other direction in the x-y plane.

The power supply 170 and the power supply 175 are configured to supply, for example, between about 500 V and about 100 kV to the electrode assembly 116. In some embodiments, the power supply 174 may also be configured to provide power to the electrode assembly 116. In some embodiments, any or all of the power supply 170, the power supply 174, or the power supply 175 are a pulsed direct current (DC) power supply. The pulsed DC wave may be from a half-wave rectifier or a full-wave rectifier. The power supply 170, the power supply 174, and/or the power supply 175 may be configured to provide power at a frequency of between about 10 Hz and about 1 MHz, such as about 5 kHz. The duty cycle of the pulsed DC power may be from between about 5% and about 95%, such as between about 20% and about 60%. In some embodiments, the duty cycle of the pulsed DC power may be between about 20% and about 40%. In other embodiments, the duty cycle of the pulsed DC power may be about 60%. The rise and fall time of the pulsed DC power may be between about 1 ns and about 1000 ns, such as between about 10 ns and about 500 ns. In other embodiments, the rise and fall time of the pulsed DC power may be between about 10 ns and about 100 ns. In some embodiments, the rise and fall time of the pulsed DC power may be about 500 ns. In some embodiments, any or all of the power supply 170, the power supply 174, and the power supply 175 are an alternating current power supply. In other embodiments, any or all of the power supply 170, the power supply 174, and the power supply 175 are a direct current power supply.

In some embodiments, any or all of the power supply 170, the power supply 174, and the power supply 175 may use a DC offset. The DC offset may be, for example, between about 0% and about 75% of the applied voltage, such as between about 5% and about 60% of the applied voltage. In some embodiments, the first electrode 158 and the second electrode 160 are pulsed negatively while the substrate support assembly is also pulsed negatively. In these embodiments, the first electrode 158 and the second electrode 150 are the substrate support assembly 138 are synchronized but offset. For example, the first electrode 158 may be at the "one" state while the substrate support assembly is at the "zero" state," then the substrate support assembly 138 in the one state while the first electrode 158 is at the zero state.

The electrode assembly 116 spans approximately the width of the substrate support assembly 138. In other embodiments, the width of the electrode assembly 116 may be less than that of the substrate support assembly 138. For example, the electrode assembly 116 may span between about 10% to about 80%, such as about 20% and about 40%, the width of the substrate support assembly 138. In embodiments where the electrode assembly 116 is less wide than the substrate support assembly 138, the actuator 190 may scan the electrode assembly 116 across the surface of the substrate 140 positioned on the first surface 134 of the substrate support assembly 138. For example, the actuator 190 may scan such that the electrode assembly 116 scans the entire surface of the substrate 140. In other embodiments, the actuator 190 may scan only certain portions of the substrate 140. Alternatively, the substrate support assembly 138 may scan underneath the electrode assembly 116.

In some embodiments, one or more magnets 196 may be positioned in the processing chamber 100. In the embodiment shown in FIG. 1, the magnets 196 are coupled to the inside surface of the sidewalls 106. In other embodiments, the magnets 196 may be positioned in other locations within the processing chamber 100 or outside the processing chamber 100. The magnets 196 may be, for example, permanent magnets or electromagnets. Representative permanent magnets include ceramic magnets and rare earth magnets. In embodiments where the magnets 196 include electromagnets, the magnets 196 may be coupled to a power source (not shown). The magnets 196 are configured to generate a magnetic field in a direction perpendicular or parallel to the direction of the electric field lines generated by the electrode assembly 116 at the first surface 134 of the substrate support assembly 138. For example, the magnets 196 may be configured to generate a magnetic field in the x-direction when the electric field generated by the electrode assembly 116 is in the y-direction. The magnetic field drives the charged species 255 (shown in FIG. 2) and polarized species (not shown) generated by the photoacid generators in the photoresist layer 150 in a direction perpendicular to the magnetic field, such as the direction parallel with the latent image lines 155. By driving the charged species 255 and polarized species in a direction parallel with the latent image lines 155, line roughness may be reduced. The uniform directional movement of the charged species 255 and polarized species is shown by the double headed arrow 270 in FIG. 2. In contrast, when a magnetic field is not applied, the charged species 255 and polarized species may move randomly, as shown by the arrows 270'.

Figure 2:
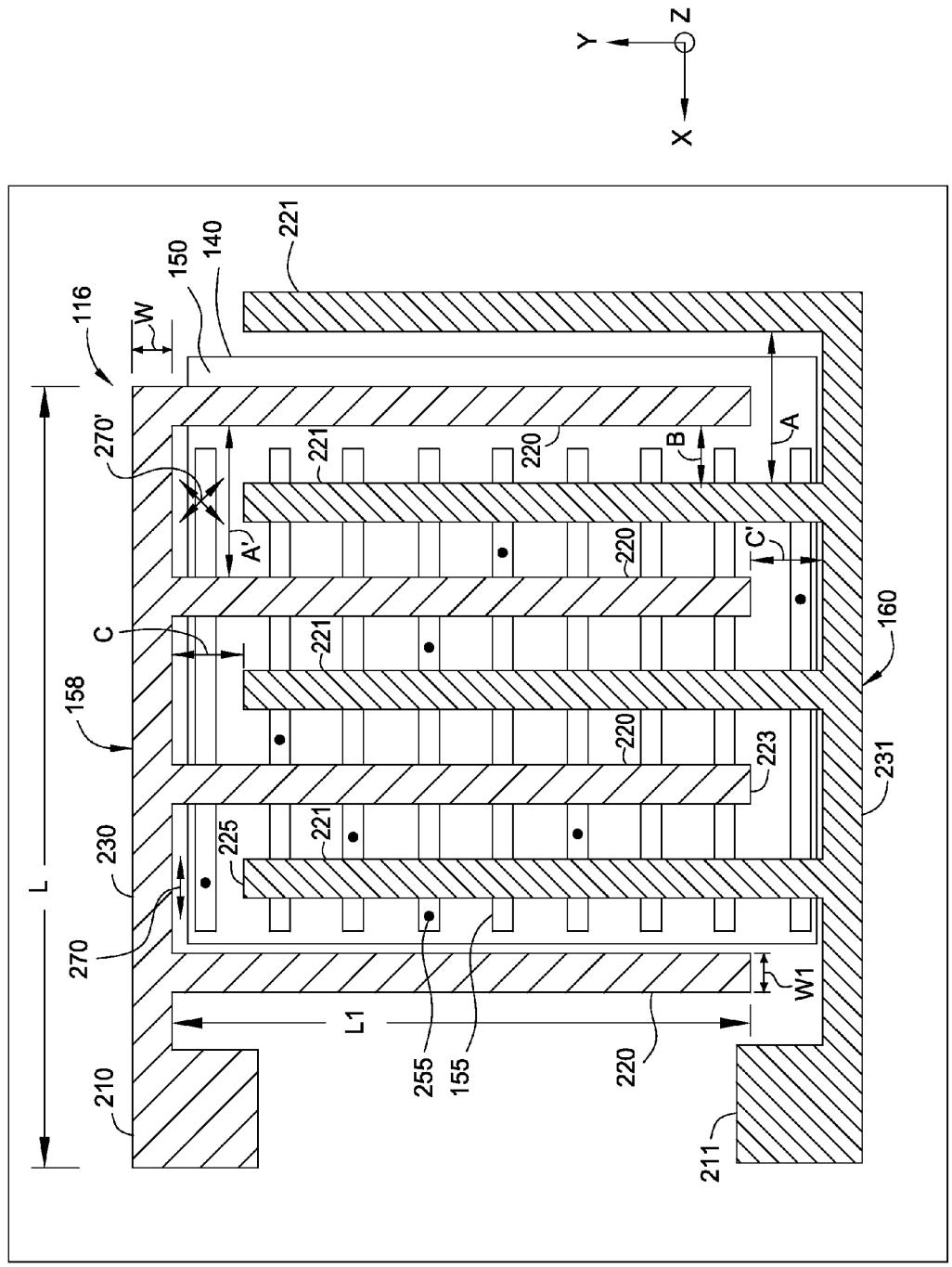
FIG. 2 is a top view of one embodiment of the electrode assembly and photoresist layer of FIG. 1.

Continuing to refer to FIG. 2, the electrode assembly 116 includes at least the first electrode 158 and the second electrode 160. The first electrode 158 includes a first terminal 210, a support structure 230, and one or more antennas 220. The second electrode 160 includes a first terminal 211, a support structure 231, and one or more antennas 221. The first terminal 210, the support structure 230, and the one or more antennas 220 of the first electrode 158 may form a unitary body. Alternatively, the first electrode 158 may include separate portions that may be coupled together. For example, the one or more antennas 220 may be detachable from the support structure 230. The second electrode 160 may similarly be a unitary body or be comprised of separate detachable components. The first electrode 158 and the second electrode 160 may be prepared by any suitable means. For example, the first electrode 158 and the second electrode 160 may be fabricated by machining, casting, or additive manufacturing.

The support structure 230 may be made from a conductive material, such as metal. For example, the support structure 230 may be made of silicon, polysilicon, silicon carbide, molybdenum, aluminum, copper, graphite, silver, platinum, gold, palladium, zinc, other materials, or mixtures thereof. The support structure 230 may have any desired dimensions. For example, the length L of the support structure 230 may be between about 25 mm and about 450 mm, for example, between about 100 mm and about 300 mm. In some embodiments, the support structure 230 has a length L approximately equal to a diameter of a standard semiconductor substrate. In other embodiments, the support structure 230 has a length L that is larger or smaller than the diameter of a standard semiconductor substrate. For example, in different representative embodiments, the length L of the support structure 230 may be about 25 mm, about 51 mm, about 76 mm, about 100 mm, about 150 mm, about 200 mm, about 300 mm, or about 450 mm. The width W of the support structure 230 may be between about 2 mm and about 25 mm. In other embodiments, the width W of the support structure 230 is less than about 2 mm. In other embodiments, the width W of the support structure 230 is greater than about 25 mm. The thickness of the support structure 230 may be between about 1 mm and about 10 mm, such as between about 2 mm and about 8 mm, such as about 5 mm. In some embodiments, the support structure 230 may be square, cylindrical, rectangular, oval, rods, or other shapes. Embodiments having round exterior surfaces may avoid arcing.

The support structure 231 may be made of the same materials as the support structure 230. The range of dimensions suitable for the support structure 230 is also suitable for the support structure 231. In some embodiments, the support structure 230 and the support structure 231 are made of the same material. In other embodiments, the support structure 230 and the support structure 231 are made of different materials. The lengths L, widths W, and thicknesses of the support structure 230 and the support structure 231 may be the same or different.

The one or more antennas 220 of the first electrode 158 may also be made from a conductive material. The one or more antennas 220 may be made from the same materials as the support structure 230. The one or more antennas 220 of the first electrode 158 may have any desired dimensions. For example, a length L1 of the one or more antennas 220 may be between about 25 mm and about 450 mm, for example, between about 100 mm and about 300 mm. In some embodiments, the support structure 230 has a length L1 approximately equal to the diameter of a standard substrate. In other embodiments, the length L1 of the one or more antennas 220 may be between about 75% and 90% of the diameter of a standard substrate. A width W1 of the one or more antennas 220 may be between about 2 mm and about 25 mm. In other embodiments, the width W1 of the one or more antennas 220 is less than about 2 mm. In other embodiments, the width W1 of the one or more antennas 220 is greater than about 25 mm. The thickness of the one or more antennas 220 may be between about 1 mm and about 10 mm, such as between about 2 mm and about 8 mm. The one or more antennas 220 may have a cross-section that is square, rectangular, oval, circular, cylindrical, or another shape. Embodiments having round exterior surfaces may avoid arcing.

Each of the antennas 220 may have the same dimensions. Alternatively, some of the one or more antennas 220 may have different dimensions than one or more of the other antennas 220. For example, some of the one or more antennas 220 may have different lengths L1 than one or more of the other antennas 220. Each of the one or more antennas 220 may be made of the same material. In other embodiments, some of the antennas 220 may be made of a material different than that of the other antennas 220.

The antennas 221 may be made of the same range of materials as the antennas 220. The range of dimensions suitable for the antennas 220 is also suitable for the antennas 221. In some embodiments, the antennas 220 and the antennas 221 are made of the same material. In other embodiments, the antennas 220 and the antennas 221 are made of different materials. The lengths L1, widths W1, and thicknesses of the antennas 220 and the antennas 221 may be the same or different.

The antennas 220 may include between 1 and about 40 antennas 220. For example, the antennas 220 may include between about 4 and about 40 antennas 220, such as between about 10 and about 20 antennas 220. In other embodiments, the antennas 220 may include more than 40 antennas 220. In some embodiments, each of the antennas 220 may be substantially perpendicular to the support structure 230. For example, in embodiments where the support structure 230 is straight, each antenna 220 may be substantially parallel to the support structure 230. Each of the antennas 220 may be substantially parallel to each of the other antennas 220. Each of the antennas 221 may be similarly positioned with respect to the support structure 231 and each other antenna 221.

Each of the antennas 220 may be substantially parallel to each of the antennas 221. In some embodiments, at least one of the antennas 220 is substantially parallel with at least one of the antennas 221. Each of the antennas 220 may be vertically aligned with each of the antennas 221. In some embodiments, at least one of the antennas 220 is vertically aligned with at least one of the antennas 221.

The support structure 230 and the support structure 231 are straight. In other embodiments the support structure 230 and the support structure 231 may not be straight. For example, the support structure 230 and the support structure 231 may be curved, jagged, or have other profiles or shapes. In these embodiments, each of the antennas 220 may still be substantially parallel to each of the other antennas 220. In these embodiments, each of the antennas 221 may be substantially parallel to each of the other antennas 221.

Each of the antennas 220 has a terminal end 223. Each of the antennas 221 has a terminal end 225. A distance C is defined between the support structure 230 and the terminal end 225. A distance C' is defined between the support structure 231 and the terminal end 223. Each of the distances C and C' may be between about 1 mm and about 10 mm. In other embodiments, the distances C and C' may be less than about 1 mm or greater than about 10 mm. In some embodiments, the distance C and the distance C' are equal. In other embodiments, the distance C and the distance C' are different.

A distance A is defined between facing surfaces of one of the antennas 221 and an adjacent one of the antennas 221. The distance A' is defined between facing surfaces of one antenna 220 and an adjacent one the antennas 220. The distances A and A' may be greater than about 6 mm. For example, the distances A and A' may be between about 6 mm and about 20 mm, such as between about 10 mm and about 15 mm. The distances A and A' between each adjacent antennas 221, 220 may be the same or different. For example, the distances A' between the first and second, second and third, and third and fourth antennas of the one or more antennas 220 may be different. In other embodiments, the distances A' may be the same.

A distance B is defined between facing surfaces of one of the antennas 220 and an adjacent one of the antennas 221. The distance B may be, for example, greater than about 1 mm. For example, the distance B may be between about 2 mm and about 10 mm, such as between about 4 mm and about 6 mm. The distance B defined between may be the same, each distance B may be different, or some distances B may be the same and some distances B may be different. Modifying the distance B allows for easy control of the electric field strength.

The antennas 220, 221 may be oriented in an alternating arrangement above the photoresist layer 150. For example, the antennas 220 of the first electrode 158 and the antennas 221 of the second electrode 160 may be positioned such that at least one of the antennas 220 is positioned between two of the antennas 221. Additionally, at least one antenna 221 may be positioned between two of the antennas 220. In some embodiments, all but one of the antennas 220 is positioned between two of the antennas 221. In those embodiments, all but one of the antennas 221 may be positioned between two of the antennas 220. In some embodiments, the antennas 220 and the antennas 221 may each have only one antenna.

In some embodiments, the first electrode 158 has a first terminal 210, and the second electrode 160 has a second terminal 211. The first terminal 210 may be a contact between the first electrode 158 and the power supply 170, the power supply 175, or a ground. The second terminal 211 may be a contact between the second electrode 160 and the power supply 170, the power supply 17, or a ground. The first terminal 210 and the second terminal 211 are shown as being at one end of the first electrode 158 and the second electrode 160, respectively. In other embodiments, the first terminal 210 and the second terminal 211 may be positioned at other locations on the first electrode 158 and the second electrode, respectively. The first terminal 210 and the second terminal 211 have different shapes and sizes than the support structure 230 and the support structure 231, respectively. In other embodiments, the first terminal 210 and the second terminal 211 may have generally the same shapes and sizes as the support structure 230 and the support structure 231, respectively.

In operation, a voltage may be supplied from a power supply, such as the power supply 170, the power supply 174, or the power supply 175, to the first terminal 210, the second terminal 211, and/or the substrate support assembly 138. The supplied voltage creates an electric field between each antenna of the one or more antennas 220 and each antenna of the one or more antennas 221. The electric field will be strongest between an antenna of the one or more antennas 220 and an adjacent antenna of the one or more antennas 221. The interleaved and aligned spatial relationship of the antennas 220, 221 produces an electric field in a direction parallel to the plane defined by the first surface 134 of the substrate assembly 138. The substrate 140 is positioned on the first surface 134 such that the latent image lines 155 are parallel to the electric field lines generated by the electrode assembly 116. Since the charged species 255 are charged, the charged species 255 are affected by the electric field. The electric field drives the charged species 255 generated by the photoacid generators in the photoresist layer 150 in the direction of the electric field. By driving the charged species 255 in a direction parallel with the latent image lines 155, line roughness may be reduced. The uniform directional movement is shown by the double headed arrow 270. In contrast, when a voltage is not applied to the first terminal 210 or the second terminal 211, an electric field is not created to drive the charged species 255 in any particular direction. As a result, the charged species 255 may move randomly, as shown by the arrows 270'.

Figure 3:
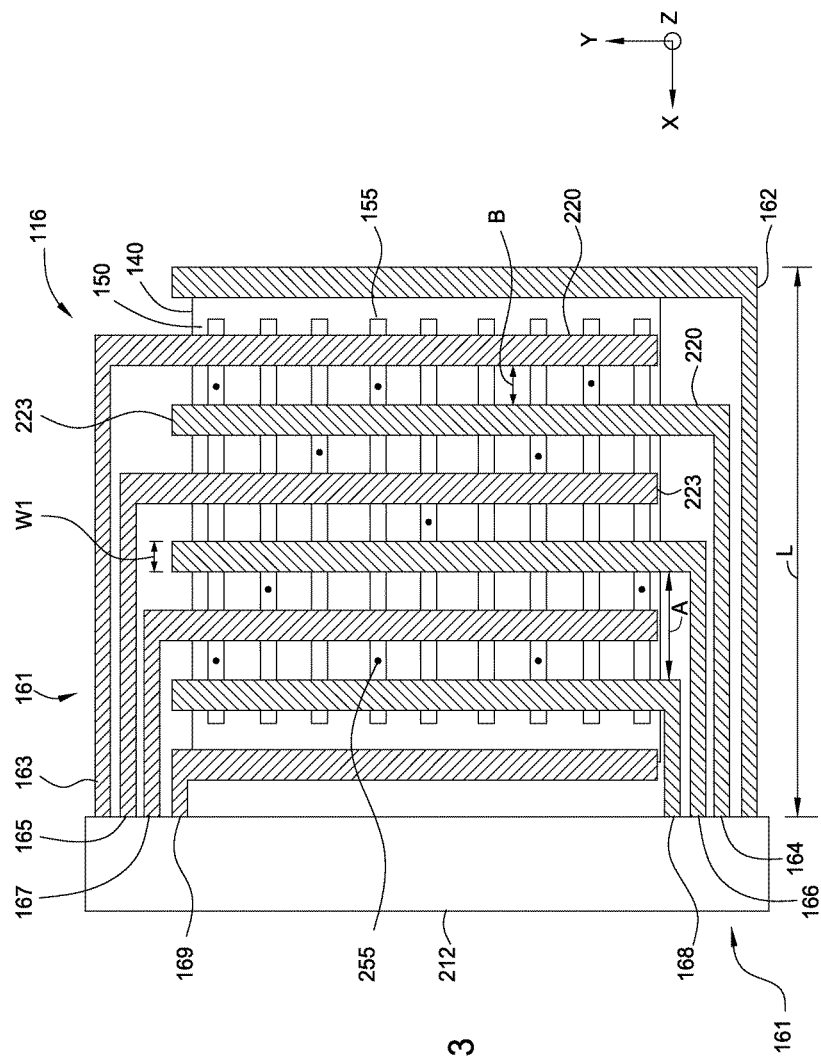
FIG. 3 is a top view of another embodiment of the electrode assembly and photoresist layer of FIG. 1.

FIG. 3 is a top view of another embodiment of the electrode assembly 116 and photoresist layer 155 of FIG. 1. As shown, the electrode assembly 116 may include a plurality of individually addressable electrodes 161, including electrodes 162 through 169. Each of the individually addressable electrodes 161 may be independently coupled to one or more power supplies via a controller 212. For example, electrode 162 may include an antenna 220 that is coupled to power supply 170 and/or power supply 175 via the controller 212, enabling the polarity of electrode 162 to be controlled independently from the polarities of electrodes 163 through 169. Similarly, electrode 163 may include an antenna 220 that is coupled to power supply 170 and/or power supply 175 via the controller 212 or via a separate controller (not shown) from the controller 212 that is coupled to the electrode 162. As such, the polarity of electrode 163 may be controlled independently from the polarities of electrode 162 and electrodes 164 through 169.

Although each of the individually addressable electrodes 161 shown in FIG. 3 includes a single antenna 220, in other embodiments, one or more of the individually addressable electrodes 161 may include more than one antenna 220. For example, in other embodiments, electrode 162 may include two or more antennas 220, each of which is driven with the same polarity during processing of a substrate 140.

The antennas 220 associated with the individually addressable electrodes 161 may be driven according to any of the techniques described above in conjunction with FIG. 2. In some embodiments, the controller 212 may be configured to independently switch one or more of the individually addressable electrodes 161 between a positive bias, a negative bias, and/or ground according to a predetermined pattern (e.g., an alternating pattern, sequentially, etc.) and/or as a function of time. For example, a positive bias (or negative bias) may be applied to each of electrodes 162 through 169, in a sequential manner, in order to drive a charged species 255 to the left (i.e., in the x-direction) relative to the orientation shown in FIG. 3. In other embodiments, two or more individually addressable electrodes 161 may be driven with a positive bias, driven with a negative bias, and/or coupled to ground in a coordinated manner, according to any useful pattern, to drive charged species 255 in one or more directions. For example, a positive bias (or negative bias) may be applied in a sequential manner to each of electrodes 162, 164, 166 and 168 while a negative bias (or positive bias) is applied to each of electrodes 163, 165, 167 and 169 in order to drive charged species 255 in a particular direction. In some embodiments, a first set of electrodes included in the plurality of individually addressable electrodes 161 may be driven according to a first pattern while a second set of electrodes included in the plurality of individually addressable electrodes 161 are driven according to a second pattern.

Figure 4:
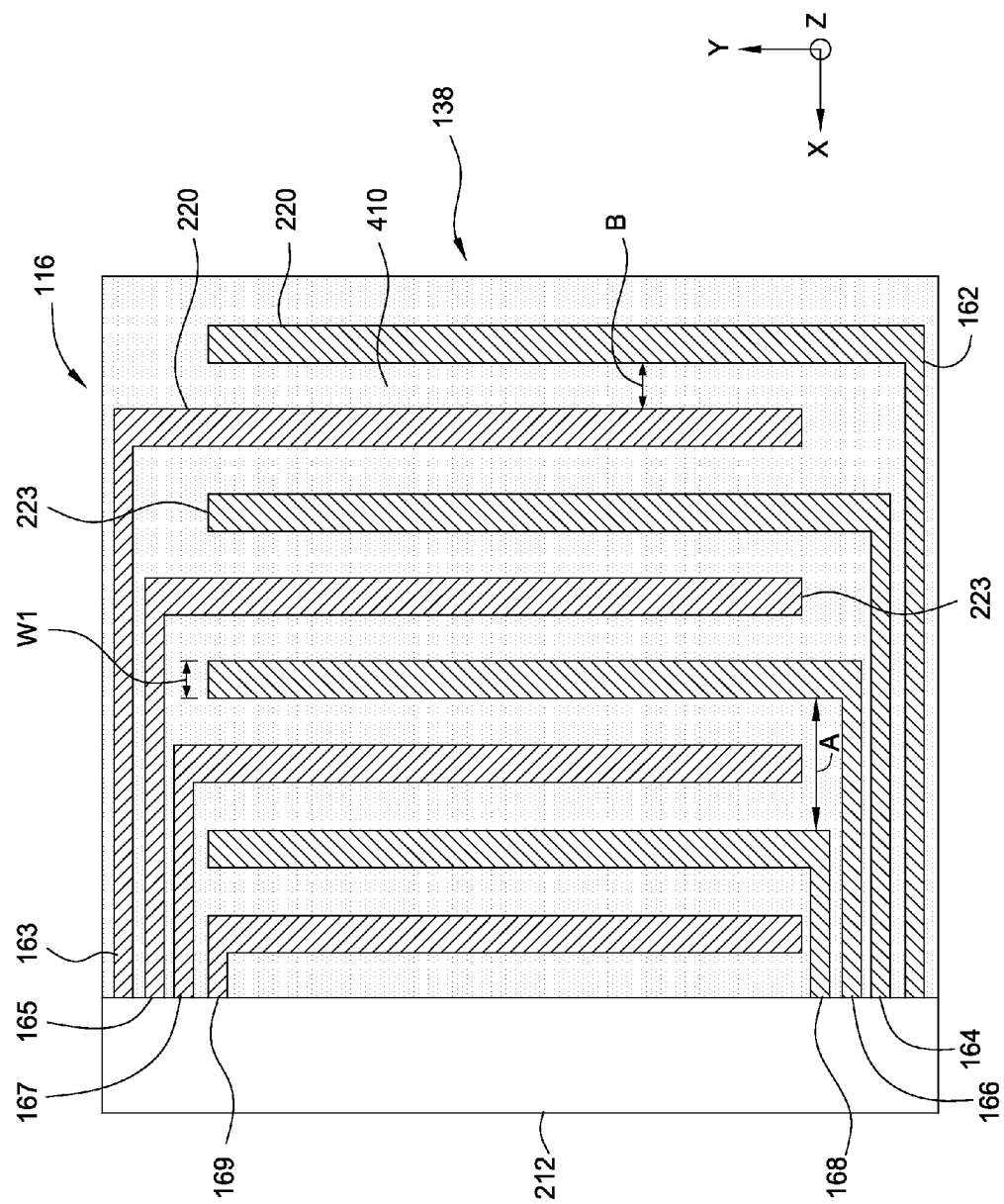
FIG. 4 is a top view of an embodiment in which the electrode assembly is proximate to, or integrated with, the substrate support structure of FIG. 1.

FIG. 4 is a top view of an embodiment in which the electrode assembly 116 is proximate to, or integrated with, the substrate support structure 138 of FIG. 1. As shown, the individually addressable electrodes 161 may be disposed on or integrated with the substrate support structure 138, such that an electric field is applied from the backside of the substrate 140. In such embodiments, the individually addressable electrodes 161 may be coupled to power source 174 or to another power supply (e.g., power supply 170 or power supply 175).

The individually addressable electrodes 161 may be positioned proximate to the first surface 134 of the substrate support 138 such that the substrate 140 is placed on top of the individually addressable electrodes 161 during processing. In other embodiments, the individually addressable electrodes 161 may be positioned proximate to the second surface 126, for example, below the substrate support structure 138. In still other embodiments, the individually addressable electrodes 161 may integrated with the substrate support structure 138 and positioned between the first surface 134 and the second surface 126.

In embodiments in which the electrode assembly 116 is disposed on top of or integrated with the substrate support structure 138, a dielectric material 410, such as a ceramic, may be disposed between the antennas 220 of the individually addressable electrodes 161. In such embodiments, the individually addressable electrodes 161 and dielectric material 410 may form a surface on which the substrate 140 can be positioned during processing. In other embodiments, no material is disposed between the antennas 220 of the individually addressable electrodes 161. In the same or other embodiments, instead of disposing a dielectric material 410 between the antennas 220 of the individually addressable electrodes 161, a vacuum may be generated between the antennas 220 during processing of the substrate 140.

When the electrode assembly 116 is positioned below the substrate 140, an electric field may be applied to the photoresist layer 150 by scanning the electrode assembly 116. In some embodiments, the electrode assembly 116 may be moved relative to the photoresist layer 150 (e.g., by moving the electrode assembly 116 and/or photoresist layer 150) while an electric field is generated by the electrode assembly 116. In other embodiments, the photoresist layer 150 and electrode assembly 116 may remain stationary while one or more of the antennas 220 included in the electrode assembly 116 are driven—using any of the patterns or techniques described above—in order to move the charged species 255 in one or more directions. In such embodiments, the number of moving parts within the processing chamber 100 may be reduced while still enabling the electrode assembly 116 to scan the electric field relative to the photoresist layer 150. In still other embodiments, an electrode assembly 116 including the two-terminal design shown in FIG. 2 may be disposed below the substrate 140 and/or integrated with the substrate support structure 138.

Figure 5A:
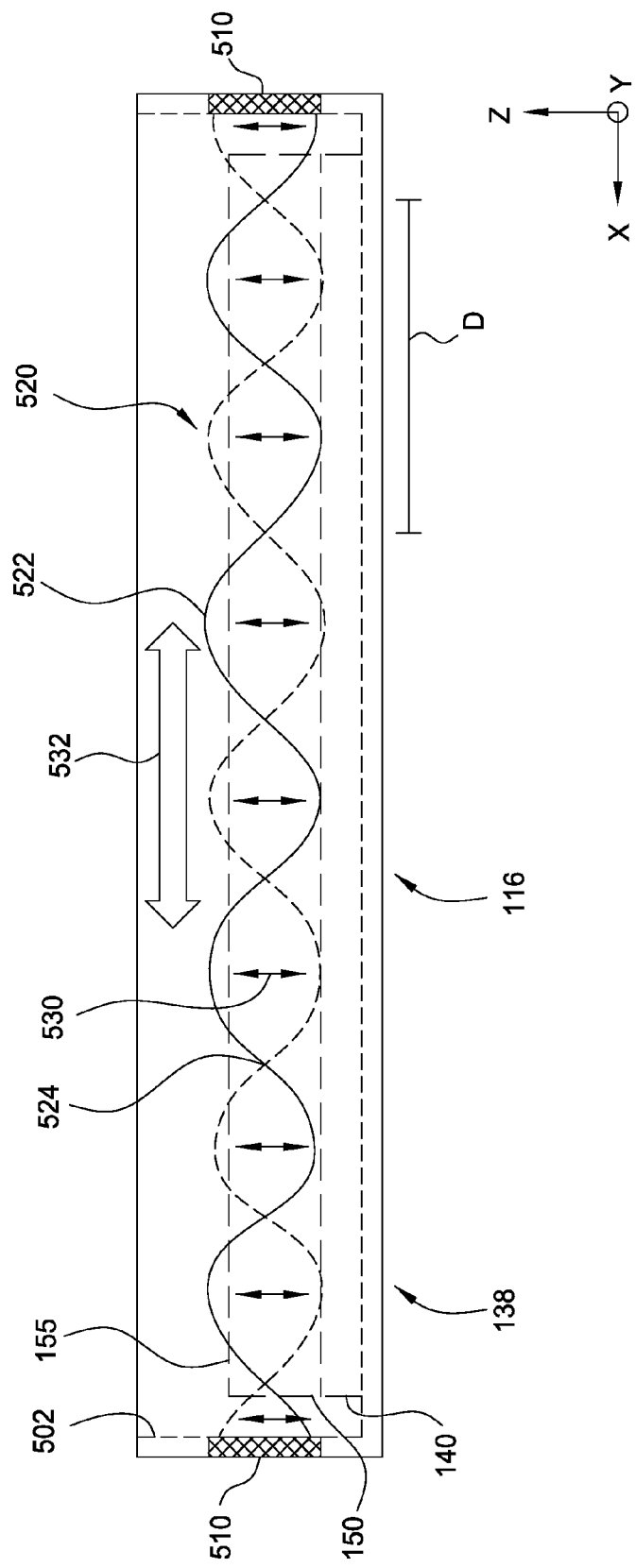
FIG. 5A is a cross-sectional view of a cavity in which the substrate may be disposed.
Figure 5B:
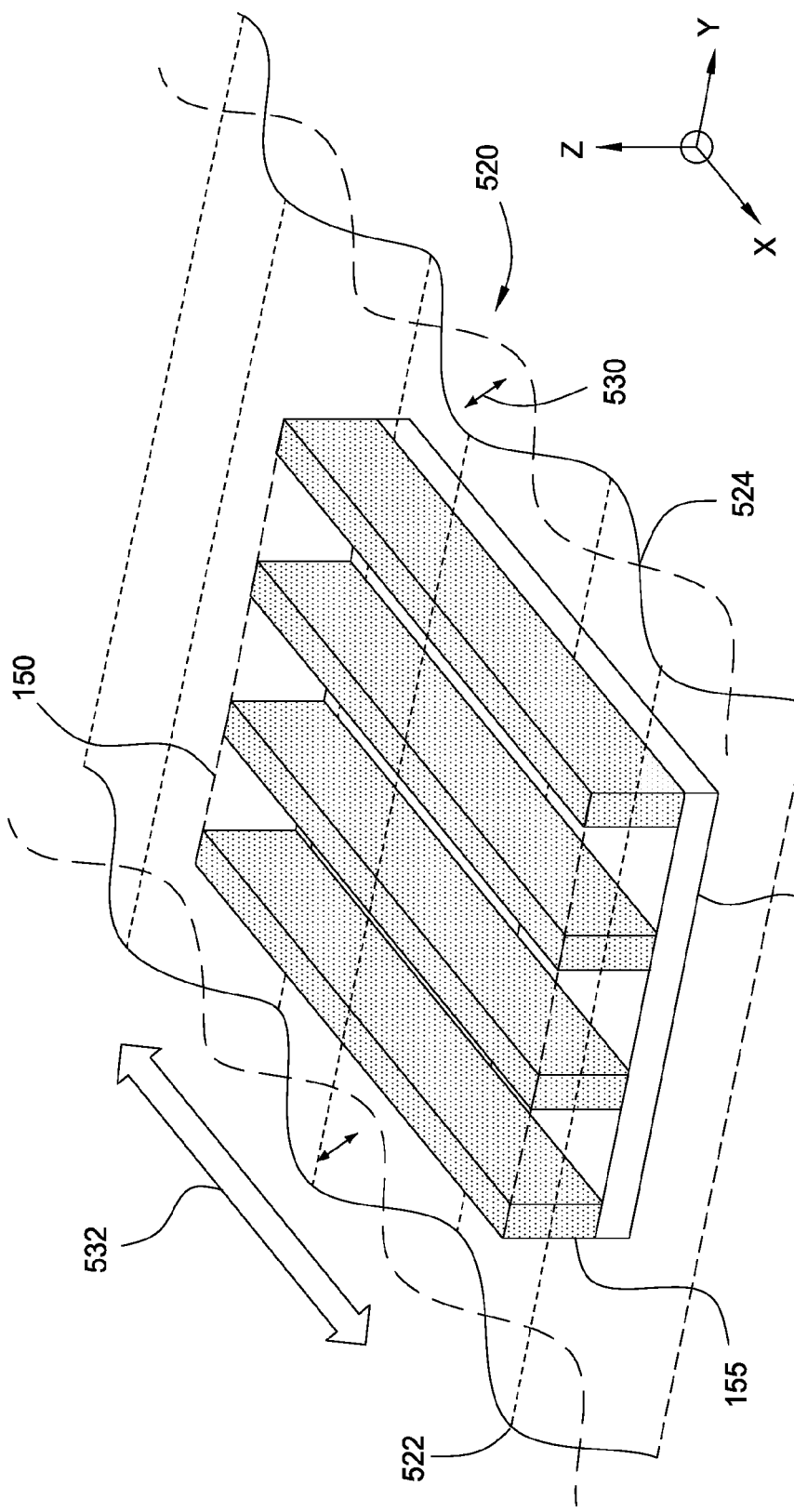
FIG. 5B is a perspective view of a standing wave that may be generated proximate to the photoresist layer of FIG. 1.

FIG. 5A is a cross-sectional view of a cavity 502 in which the substrate 140 may be disposed. FIG. 5B is a perspective view of a standing wave 520 that may be generated proximate to the photoresist layer 150 of FIG. 1. In various embodiments, the cavity 502 may be positioned above or integrated with the substrate support structure 138. The cavity 502 includes one or more generators 510 that are configured to generate a standing wave 520 inside of the cavity 502. The standing wave 520 may include nodes 522 and antinodes 524.

Generating a standing wave 520 proximate to the photoresist layer 150 may enable charged species 255 included in the photoresist layer 150 to be driven in one or more directions. In some embodiments, at least a portion of the standing wave 520 extends into the photoresist layer 150. However, the standing wave 520 may be generated at any location with respect to the substrate 140 and/or photoresist layer 150. In general, the standing wave 520 drives the charged species 255 generated by the photoacid generator in one or more directions that are parallel to the direction of the latent image lines 155. For example, oscillation 530 of the nodes 522 may cause the charged species 255 to move along the z-direction. In some embodiments, the phase of the standing wave 520 may be varied in order to generate movement 532 of the standing wave 520 along the x-direction. In other embodiments, one or more generators 510 may be used to generate non-standing waves proximate to the photoresist layer 150.

Standing waves 520 may be generated within the cavity 502 using any practical means. The wavelength(s) generated by the generator(s) 510 may depend upon the composition of the photoresist layer 150. For example, the wavelength(s) generated by the generator(s) 510 may be selected such that the direction of the charged species 255 may be controlled without further exposing the photoresist layer 150 (e.g., without substantially altering the latent acid image in the photoresist layer 150). In some embodiments, the one or more generators 510 generate standing waves 520 using wavelengths in the radiofrequency range. In such embodiments, wavelengths that are greater than approximately 5 centimeters (i.e., frequencies of less than about 6 GHz) may be used. For example, the generator(s) 510 may be microwave generators and/or long-wavelength lasers, such as an infrared laser or $CO_2$ laser (e.g., running at a wavelength of about 1550 nm). In some embodiments, the period D of the resulting standing wave 520 may be approximately 10 to 5000 nanometers, such as approximately 100 to 500 nanometers.

Standing waves 520 may be used to control the direction in which charged species 255 move in addition to, or instead of, controlling the direction of the charged species 255 by generating electric fields and/or magnetic fields, as described above. When these techniques are used in conjunction with one another, the electrode assembly 116 may be disposed above or below the substrate support structure 138, and a standing wave 520 may be generated within a cavity 502 that is disposed on or integrated with the substrate support structure 138. Additionally, the electrode assembly 116 may be integrated with the substrate support structure 138, as illustrated in FIG. 4, and standing waves 520 may be generated above (e.g., on top of) the electrode assembly 116.

FIG. 6 is a flow diagram of a representative method 600 of processing a substrate 140. The method 600 for processing the substrate 140 has multiple stages. The stages can be carried out in any order or simultaneously (except where the context excludes that possibility), and the method 600 can include one or more other stages which are carried out before any of the defined stages, between two of the defined stages, or after all the defined stages (except where the context excludes that possibility). Not all embodiments include all the stages.

In general, the methods 600 include a stage 610. Stage 610 includes applying a photoresist containing a photoacid generator to a substrate 140. The methods 600 may also include stage 620. Stage 620 includes heating the substrate 140 in a pre-exposure bake. In general, the methods 600 also include stage 630. Stage 630 includes exposing the substrate 140 to electromagnetic radiation. The methods 600 may further include stage 640. Stage 640 includes heating the substrate 140 in a post-exposure bake. The methods 600 may also include stage 650 and stage 660. Stage 650 and stage 660 include developing the substrate 140 and post-treating the substrate 140, respectively.

In general, the method 600 may also include stage 601 and/or stage 602. Stage 601 includes applying an electric and/or a magnetic field to the substrate 140 via the electrode assembly 116 (e.g., via the first electrode 158, the second electrode 160, and/or the individually addressable electrodes 161). Stage 602 includes generating a standing wave proximate to the substrate 140. In both stage 601 and stage 602, the charged species 255 generated by the photoacid generator may be driven in one or more directions (e.g., the z-direction and/or the x-direction) that are parallel to the direction of the latent image lines 155 while the substrate is being heated. Stage 601 and stage 602 are described herein as occurring during the stage 640. However, stage 601 and stage 602 may occur during any other stage or combination of stages.

At stage 610, a photoresist is applied to the substrate 140 to form a photoresist layer 150. The photoresist layer 150 may be applied by, for example, by spin coating via a spin coating apparatus. For example, the substrate 140 may be introduced into and positioned on a rotatable chuck of a spin coater. Thereafter, a solution containing the photoresist may be applied to the substrate 140 while the substrate 140 is rapidly spun, resulting in a uniform photoresist layer 150.

In some embodiments, the spin coater may be part of a processing system, such as the processing system 700. In embodiments in which the spin coater is part of the processing system 700, the spin coater may be within the coating chamber 720. In such embodiments, the substrate 140 may enter the processing system 700 through the load port 710 and thereafter be transferred to the coating chamber 720 through a transfer chamber 705.

The spin coater may include electrode assembly 116, which may be coupled to one or more power sources. For example, the electrode assembly 116 may be disposed in the coating chamber 720. The substrate 140 may be positioned relative to the electrode assembly 116 such that the electrode assembly 116 produces an electric field parallel to the lateral dimensions of the substrate 140. In some embodiments, the electrode assembly 116 may also be coupled to an actuator 190. The spin coater may also include magnets 196. The magnets 196 may be configured to generate a magnetic field in a direction perpendicular or parallel to the direction of the electric field lines generated by the electrode assembly 116.

The photoresist may include a solvent, a photoresist resin, and a photoacid generator. The photoresist resin may be any positive photoresist resin or any negative photoresist resin. Representative photoresist resins include acrylates, Novolac resins, poly(methylmethacrylates), and poly(olefin sulfones). Other photoresist resins may also be used.

Upon exposure to electromagnetic radiation, the photoacid generator generates charged species 255, such as a cation and an anion. The photoacid generator may also generate polarized species. The photoacid generator sensitizes the resin to electromagnetic radiation. Representative photoacid generators include sulfonate compounds, such as sulfonated salts, sulfonated esters, and sulfonyloxy ketones. Other suitable photoacid generators include onium salts, such as aryl-diazonium salts, halonium salts, aromatic sulfonium salts and sulfoxonium salts or selenium salts. Other representative photoacid generators include nitrobenzyl esters, s-triazine derivatives, ionic iodonium sulfonates, perfluoroalkanesulfonates, aryl triflates and derivatives and analogs thereof, pyrogallol derivatives, and alkyl disulfones. Other photoacid generators may also be used.

At optional stage 620, the substrate 140 may be heated in a pre-exposure bake. During the pre-exposure bake, the substrate 140 is heated to partially evaporate the photoresist solvents. The pre-exposure bake of stage 620 and the photoresist application of stage 610 may occur in the same chamber. For example, both stages may occur in a chamber that includes the spin coater. In one embodiment, both stages may occur in the coating chamber 720. Alternatively, the substrate 140 may be transferred to a different processing chamber. For example, in an embodiment using the processing system 700, the substrate 140 may be transferred from the coating chamber 720 to a processing chamber 100 through a transfer chamber 705.

As noted above, the processing chamber 100 includes an electrode assembly 116. The substrate 140 may be positioned in the processing chamber 100 relative to the electrode assembly 116 such that the electrode assembly 116 may produce an electric field parallel to the lateral dimensions of the substrate 140. In some embodiments, the electrode assembly 116 of the processing chamber 100 may also be coupled to an actuator 190. The processing chamber 100 may also include magnets 196. The magnets 196 may be configured to generate a magnetic field in a direction perpendicular or parallel to the direction of the electric field lines generated by the electrode assembly 116.

At stage 630, the substrate 140 and portions of the photoresist layer 150 are exposed to electromagnetic radiation. Stage 630 may be performed in an exposure chamber. In one embodiment, after completion of stage 620, the substrate 140 is transferred to an exposure chamber. In an embodiment using the processing system 700, the substrate 140 may be transferred from the processing chamber 100 to the exposure chamber 730 through the transfer chamber 705. The exposure chamber may also include an electrode assembly 116 coupled to one or more power sources and/or an actuator 190 and magnets 196. The substrate 140 may be positioned in the exposure chamber relative to the electrode assembly 116 and magnets 196 as described in relation to the coating chamber 720.

In stage 630, portions of the photoresist layer 150 are selectively exposed and portions of the photoresist layer 150 are selectively unexposed. Portions of the photoresist layer 150 exposed to electromagnetic radiation may have different chemical properties than the portions of the photoresist layer 150 not exposed to the electromagnetic radiation. The acid generated by the photoacid generator results in a latent acid image in the resist resin. In some embodiments, a photomask or reticle may be positioned between the photoresist layer 150, and the photoresist layer 150 may be exposed to electromagnetic radiation through the mask or reticle. The mask or reticle may be configured to transfer a pattern containing lines to the photoresist layer 150. In other embodiments, a pattern containing lines may be transferred to the photoresist layer 150 using maskless lithography techniques. The transferred latent image lines 155 may have any desired length, width, and spacing between latent image lines 155. For example, in some embodiments, the line widths and line spacings may be between about 10 nm and about 16 nm. In other embodiments the line widths and spacings may be less than about 10 nm or greater than about 16 nm. In some embodiments, the length of the latent image line 155 is about 150% of the width of the latent image line 155. In other embodiments, the length of the latent image line 155 is greater than about 200% of the width of the latent image line 155, such as for example, greater than about 1000% of the width of the latent image line 155.

The electromagnetic radiation generally has a wavelength suitable for exposing the photoresist layer 150. For example, the electromagnetic radiation may have a wavelength in the extreme ultra violet (EUV) range, such as between about 10 nm and about 124 nm. In other embodiments, the electromagnetic radiation may be generated by an argon fluoride laser. In such an embodiment, the electromagnetic radiation may have a wavelength of about 193 nm. In some embodiments, the wavelength may be 248 nm. Other embodiments may use different wavelengths. In some embodiments, the electromagnetic radiation is from an electron beam or an ion beam.

At stage 640, the substrate 140 is heated in a post-exposure bake process. In one embodiment, after the completion of stage 630, the substrate 140 is transferred to a processing chamber. In some embodiments, the processing chamber may be the processing chamber 100. In embodiments using the processing system 700, the substrate 140 may be transferred from the exposure chamber 730 to the processing chamber 100 through the transfer chamber 715. The substrate 140 may be positioned on the first surface 134 of the substrate support assembly 138. The power source 174 may provide power to the embedded heater 132 to heat the substrate 140. The embedded heater 132 may quickly heat the substrate 140 and the photoresist layer 150. For example, the embedded heater 132 may raise the temperature of the photoresist layer 150 from ambient temperature to between about 70° C. and about 160° C., such as between about 90° C. and 140° C., in less than about 2 seconds. The temperature of the substrate 140 and the photoresist layer 150 may be maintained at between about 70° C. and about 160° C., such as between about 90° C. and 140° C., during stage 640. In other embodiments, the substrate 140 may be heated by a resistive heater, a heat lamp, a laser, or other heat source. In still other embodiments, the substrate 140 may be heated by more than one of the embedded heater 132, the resistive heater, the heat lamp, the laser, and the other heat sources. In some embodiments, the power supply 170 and the power supply 175 may also heat the substrate 140.

A heat lamp, laser, or other heat source may also heat the antennas 220 and the antennas 221. For example, the heat lamp, laser, or other heat source may heat the antennas 220 and the antennas 221 to between about 70° C. and about 160° C., such as between about 90° C. and 140° C., during stage 340. In some embodiments, the temperatures of the antennas 220 and the antennas 221 are controlled to substantially match the temperature of the substrate support assembly 138. Matching the temperature of the substrate support assembly 138 to the temperature of the antennas 220 and the antennas 221 allows for more uniform control of the temperature of the photoresist layer 150 during stage 640. During the post-exposure bake, photoacid generators in the photoresist layer 150 may continue to alter the chemical properties of the exposed portions of the photoresist layer 150.

Optionally during stage 640, the pressure of the processing chamber 100 may be reduced by a vacuum source. The processing volume 112 may be reduced, for example, by the vacuum pump coupled to the processing volume 112 through the pumping port 114. In some embodiments, the pressure of the processing chamber 100 may be reduced to at least $10^{-5}$ Torr. For example, the pressure may be reduced to between about $10^{-6}$ Torr and about $10^{-8}$ Torr. Reducing the pressure may reduce or eliminate arcing during processing. In some embodiments, the pressure of the processing chamber 100 is not reduced. By not reducing the pressure, heat from the heat sources may be more readily transferred to the substrate 140. In some embodiments, the pressure in the processing volume 112 is reduced to a pressure between ambient pressure and $10^{-5}$ Torr.

During stage 640, a field is applied to the photoresist layer 150 to drive the charged species 255 created by the photoacid generator in the direction of the latent image lines 155. The field may be an electric field or both an electric and a magnetic field. An electric field may be applied to the photoresist layer 150, for example, by the electrode assembly 116. In some embodiments, the electrode assembly 116 and the photoresist layer 150 remain stationary with respect to each other while the electrode assembly 116 generates an electric field. In other embodiments, the electrode assembly 116 and the photoresist layer 150 move relative to each other while the electrode assembly 116 generates an electric field. Relative motion may, for example, allow the electric field to scan the surface of the substrate 140. As discussed below, scanning the surface of the substrate 140 with an electric field may allow for higher throughput and more precise control of the application of the electric field to the substrate 140. Scanning also allows for the application of a more uniform electric field to the substrate 140, which allows for a more uniform line edge roughness reduction.

In some embodiments, the distance d between the substrate 140 and the electrode assembly 116 may be adjusted. For example, in the embodiment shown in FIG. 1, the distance d may be adjusted by either the actuator 190 or by the lift system coupled to the substrate support assembly 138. The actuator 190 may move the electrode assembly 116 towards the substrate 140. Additionally or alternatively, the lift system coupled the substrate support assembly 138 may move the substrate 140 towards the electrode assembly 116. In some embodiments, the distance d is between about 0.1 mm and about 100 mm. For example, the distance d may be between about 8 mm and about 14 mm. In other embodiments, the distance d is less than about 0.1 mm or greater than about 100 mm. Adjusting the distance d allows the strength of the electric field applied to the charged species 255 to be adjusted. A smaller distance d applies a stronger electric field to the charged species 255. A stronger electric field may then enable better control of the direction in which the charged species 255 diffuses.

In embodiments where the electrode assembly 116 and the photoresist layer 150 remain stationary with respect to each other—such as when the electrode assembly 116 is disposed below the substrate 140—the electrode assembly 116 may have lateral dimensions that are larger than or substantially the same as the lateral dimensions of the photoresist layer 150. One such embodiment is illustrated in FIG. 4. In other embodiments, the lateral dimensions of the electrode assembly 116 may be smaller than the lateral dimensions of the photoresist layer 150. In one embodiment where the lateral dimensions of the electrode assembly 116 are smaller than the lateral dimensions of photoresist layer 150, the electrode assembly 116 may be positioned over a specific region of the photoresist layer 150. For example, the specific region of the photoresist layer 150 may be where at least some of the latent image lines 155 are transferred during stage 630.

The electrode assembly 116 may generate an electric field in a direction along the length of the latent image lines 155. In other words, the electrode assembly 116 may generate an electric field parallel to the latent image lines 155. The generated electric field may have a field strength of, for example, between about 0.1 MV/m and about 100 MV/m, such as, between about 0.5 MV/m and about 10 MV/m. The electric field may be generated by, for example, the power supply 170, the power supply 175, and/or the power supply 174. The power provided by the one or more power supplies may have the properties discussed above in relation to FIG. 1. The above power conditions may allow for the charged species 255 to diffuse in the direction of the latent image lines 155 on the order of between about 10 nm and about 50 nm while limiting the diffusion perpendicular to the latent image lines 155 to less than about 5 nm. In some embodiments, the diffusion in the direction of the latent image lines 155 may be less than about 10 nm or greater than about 50 nm while the perpendicular diffusion is about 5 nm. In some embodiments, the pulsed DC power conditions allow for the electric field to act on the charged species 255 long enough to move the charged species 255 between about 10 nm and about 50 nm before switching the polarity. In other embodiments, the charged species may move less than about 10 nm or more than about 50 nm before switching polarity. In some embodiments, the power conditions provide a ratio of diffusion of the charged species 255 substantially along the direction of the latent image lines 155 to the diffusion of charged species 255 in a direction substantially perpendicular to the direction of the latent image lines 155 greater than about 5:1. For example, the ratio may be greater than about 10:1, such as greater than about 20:1. In some embodiments the ratio is between about 5:1 and about 20:1. In other embodiments, the ratio is between about 10:1 and about 20:1.

The power supply 170, the power supply 174, and/or the power supply 175 may continue to apply a voltage to the first terminal 210 and/or the second terminal 211 for a period of time. For example, the power supply may continue to supply the voltage for between about 30 seconds and about 180 seconds, such as between about 45 seconds and about 90 seconds, such as about 60 seconds. In other embodiments, the voltage may be applied for fewer than 30 seconds or more than 180 seconds. The length of time that the voltage is applied may depend on the photoresist layer 150 dimensions, the electrode assembly 116, the amount of photoacid generator incorporated into the photoresist layer 150, the electric field strength, and other variables. If the first terminal 210, the second terminal 211, or substrate support assembly 138 is not supplied power, the respective component may be connected to a ground.

The strength of the electric field applied to the photoresist layer 150 can be modified by varying several variables. For example, the electric field strength can be modified by the amount of voltage applied to the first terminal 210 and/or the second terminal 211. In some embodiments, the electric field strength may also be controlled by varying the distance d between the electrode assembly 116 and the photoresist layer 150. The electric field strength may also be modified by the dimensions of the electrode assembly 116. For example, the dimensions A, B, and C may affect the strength of the electric field at the photoresist layer 150.

In embodiments where the electrode assembly 116 and the photoresist layer 150 move relative to each other, the electrode assembly 116 and the photoresist layer 150 may have identical, substantially similar, or different lateral dimensions. In one embodiment, one of the lateral dimensions, such as the x-dimension, is at least substantially the same size as the x-dimension of the photoresist layer 150 and/or the substrate 140. In that embodiment, the electrode assembly 116 may have a size in another lateral dimension, such as the y-dimension, that is smaller than the y-dimension photoresist layer and/or substrate 140. In that embodiment, the relative movement between the electrode assembly 116 and the photoresist layer 150 may be such that the x-dimension of the electrode assembly 116 moves relatively along the y-dimension of the photoresist layer 150. The relative motion may result in the electrode assembly 116 scanning above the entirety or a portion of the surface of the photoresist layer 150. Scanning may allow for higher throughput and for more precise control of the application of the electric field to the photoresist layer 150. For example, in some embodiments, the pattern transferred to the photoresist layer 150 may have a first set of latent image lines 155 at a first location and a second set of latent image lines 155 at a second location. The first set of latent image lines 155 and the second set of latent image lines 155 may be oriented in different directions. Scanning may allow for an electric field to be applied to the first set of latent image lines 155 by the electrode assembly 116 such that the electric field is parallel to the first set of latent image lines 155. Thereafter, the actuator 190 may move the electrode assembly 116 to the second location and orient the electrode assembly 116 so that the electric field generated by the electrode assembly is parallel to the second set of latent image lines 155.

In another embodiment where the electrode assembly 116 is smaller than the photoresist layer 150, both lateral dimensions of the electrode assembly 116 are smaller than the lateral dimensions of the photoresist layer 150. In those embodiments, the electrode assembly 116 may scan the entirety or a portion of the surface of the photoresist layer 150. In some embodiments where both lateral dimensions of the electrode assembly 116 are smaller than the lateral dimensions of the photoresist layer 150, the electrode assembly 116 may have lateral dimensions sized to be substantially similar to the lateral dimensions of die on the substrate 140. In those embodiments, the electrode assembly 116 may sequentially apply an electric field to each die or to only some of the die on the substrate 140.

In one embodiment, the actuator 190 may provide the relative motion between the photoresist layer 150 and the electrode assembly 116. In other embodiments, the substrate support assembly 138 may be configured to provide relative motion between the photoresist layer 150 and the electrode assembly 116. In still other embodiments, both the actuator 190 and a movable substrate support assembly 138 may effectuate relative motion. In other embodiments, a substrate 140 may be positioned on a conveyor system, and the conveyor system may move the substrate 140 relative to one or more electrode assemblies 116. The relative motion between the electrode assembly 116 and the photoresist layer 150 may have a velocity of between about 1 mm/sec and about 1000 mm/sec, such as between about 10 mm/sec and about 100 mm/sec, such as about 500 mm/sec. The velocity of relative motion may be adjusted to ensure that the photoresist layer 150 is exposed to the electric field for a time long enough to reduce the line edge/width roughness to the desired level. The velocity may depend on several variables, including the concentration of and identity of the photoacid generator and the composition of photoresist resin.

In some embodiments including relative motion between the electrode assembly 116 and the photoresist layer 150, the distance d (z-direction) varies over time. Varying d during scanning alters the electric field strength, thus modulating the profile of the photoresist layer 150. In other embodiments including relative motion disclosed herein, the substrate support assembly 138 rotates relative to the electrode assembly 116. For example, the substrate support assembly 138 may rotate about the z-axis. The substrate support assembly 138 may be configured to continuously or constantly rotate, or the substrate support assembly 138 may be configured to rotate in a step manner. For example, the substrate support assembly 138 may rotate a predetermined amount, such as 90°, 180°, or 270°, and then rotation may stop for a predetermined amount of time. In other embodiments, the electrode assembly 116 rotates relative to the substrate support assembly 138. The electrode assembly 116 may rotate in the same manner as the substrate support assembly 138.

In embodiments including relative motion, the electric field may also be generated by any or all of the power supply 170, the power supply 174, and the power supply 175. The properties of the applied voltage and power may be the same in embodiments including relative motion as in embodiments involving no relative movement. In scanning embodiments, the power may be applied for between about 30 seconds and about 360 seconds, such as between about 45 seconds and about 180 seconds, such as about 90 seconds. The length of time that the voltage is applied may depend on the photoresist layer 150 dimensions, the electrode assembly 116, the amount of photoacid generator incorporated into the photoresist, the electric field strength, the rate of relative motion, and other variables. In embodiments including relative motion between the substrate 140 and the electrode assembly 116, the relative motion may occur only while an electric field is applied, only while an electric field is not applied, or both while an electric field is applied and while an electric field is not applied. For example, in embodiments where the relative motion is caused by the rotation of the substrate support assembly 138, the electric field may be applied during the rotation, the electric field may not be applied during the rotation, or the electric field may be applied both while the substrate support assembly 138 is rotating and not rotating.

In some embodiments, a magnetic field is generated in order to drive the charged species 255 in the direction of the latent image lines 155. Magnets, such as the magnets 196, may apply a magnetic field in a direction perpendicular or parallel to the latent image lines 155, resulting in lines having a reduced line edge/width roughness. The magnets 196 may be, for example, permanent magnets or electromagnets. In other embodiments, the magnets 196 may be positioned elsewhere in the processing chamber 100 or outside the processing chamber 100. The magnetic field strength at the photoresist layer 150 may be between about 0.1 Tesla (T) and about 10 T, such as between about 1 T and about 5 T. In embodiments including a magnetic field, the magnets 196 may remain stationary or move relative to the photoresist layer 150 and the substrate 140.

In some embodiments, the electrode assembly 116 generates and electric field and the magnets 196 generate a magnetic field. The electric field may be generated in the direction of the latent image lines 155 and a magnetic field may be generated in a direction perpendicular to the latent image lines 155. In an embodiment including a magnetic field and an electric field the magnetic field may be perpendicular to the electric field.

Additionally, during stage 640, standing waves 520 may be generated proximate to the substrate 140 in order to drive the charged species 255 in one or more directions that are parallel to the latent image lines 155. For example, the oscillation 530 of a standing wave 520 may drive the charged species 255 along the z-direction and/or the phase of the standing wave 520 may be varied to drive the charged species 255 along the x-direction.

At optional stage 650, the photoresist is developed. In one embodiment, after the completion of stage 640, the substrate 140 is transferred to a development chamber. In embodiments using the processing system 700, the substrate 140 may be transferred from the processing chamber 100 to the development chamber 740 through the transfer chamber 705. The development chamber 740 may also include an electrode assembly 116 coupled to one or more power sources and/or an actuator 190 and magnets 196. The substrate 140 may be positioned in the development chamber 740 relative to the electrode assembly 116 and magnets 196 as described in relation to the coating chamber 720.

In stage 650, the photoresist layer 150 may be developed by, for example, exposing the photoresist layer 150 to a developer, such as a sodium hydroxide solution, a tetramethylammonium hydroxide solution, xylene, or Stoddard solvent. The substrate 140 may be rinsed with, for example, water or n-butylacetate. By stage 650, the latent image lines 155 may no longer be latent. The lines 155 on the substrate 140 will have less line edge/width roughness compared to conventional techniques.

At optional stage 660, additional post-processing steps may be performed. The additional post-processing steps may be performed, for example, in a post-processing chamber. In an embodiment using the processing system 700, the substrate 140 may be transferred from the development chamber 740 through the transfer chamber 705 to the prost-processing chamber 750 for post-processing. For example, after rinsing, the substrate 140 may be hard baked and inspected. After inspection, an etching process may be performed on the substrate 140. The etching process uses the features of photoresist layer 150, such as the lines 155, to transfer a pattern to the layer 145.

The previously described embodiments have many advantages, including the following. For example, the embodiments disclosed herein may reduce or eliminate line edge/width roughness. Additionally, the embodiments disclosed herein may allow for new fabrication process flows. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

What is claimed is:

1. An apparatus for processing a substrate, the apparatus comprising:
    a substrate support, the substrate support comprising a surface configured to support a substrate thereon;
    a heat source, the heat source configured to heat a substrate positioned on the surface of the substrate support; and
    an electrode assembly positioned proximate to the surface of the substrate support, the electrode assembly comprising a plurality of individually addressable electrodes, each individually addressable electrode comprising one or more antennas, wherein the electrode assembly is configured to generate an electric field in a direction substantially parallel to the surface of the substrate support.

2. The apparatus of claim 1, wherein the plurality of individually addressable electrodes comprises about 8 to about 80 individually addressable electrodes.

3. The apparatus of claim 1, wherein the electrode assembly is on the surface of the substrate support.

4. The apparatus of claim 1, wherein the electrode assembly is integrated with the substrate support.

5. The apparatus of claim 1, wherein the antennas associated with the plurality of individually addressable electrodes are substantially parallel to each other.

6. The apparatus of claim 5, wherein the distance between each adjacent antenna included in the plurality of individually addressable electrodes is substantially the same.

7. The apparatus of claim 6, wherein the substrate support and electrode assembly are positioned within a vacuum chamber.

8. The apparatus of claim 1, further comprising:
    a cavity positioned proximate to the surface of the substrate support; and
    at least one generator proximate to the cavity and configured to generate a standing wave within the cavity.

9. The apparatus of claim 8, wherein the at least one generator is configured to generate a frequency of less than about 6 GHz.

10. The apparatus of claim 8, wherein the at least one generator is configured to generate a standing wave having a period of about 100 nanometers to about 500 nanometers.

11. The apparatus of claim 8, wherein the at least one generator comprises at least one of a microwave generator and a long-wavelength laser.

12. An apparatus for processing a substrate, the apparatus comprising:
    a substrate support, the substrate support comprising a surface configured to support a substrate thereon;
    a heat source, the heat source configured to heat a substrate positioned on the surface of the substrate support;
    an electrode assembly positioned proximate to the surface of the substrate support, the electrode assembly comprising a plurality of individually addressable electrodes, each individually addressable electrode comprising one or more antennas, wherein the electrode assembly is configured to generate an electric field in a direction substantially parallel to the surface of the substrate support, and wherein the electrode assembly is integrated with the substrate support;
    a cavity positioned proximate to the surface of the substrate support; and
    at least one generator proximate to the cavity and configured to generate a standing wave within the cavity.

* * * * *